United States Patent
Han et al.

(10) Patent No.: US 9,378,184 B2
(45) Date of Patent: Jun. 28, 2016

(54) ACCUMULATOR AND DATA WEIGHTED AVERAGE DEVICE INCLUDING THE ACCUMULATOR

(71) Applicant: Electronics and Telecommunications Research Institute, Daejeon (KR)

(72) Inventors: Seon-Ho Han, Daejeon (KR); Hyun Kyu Yu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 449 days.

(21) Appl. No.: 13/854,041

(22) Filed: Mar. 29, 2013

(65) Prior Publication Data

US 2013/0268572 A1   Oct. 10, 2013

(30) Foreign Application Priority Data

Apr. 10, 2012   (KR) .................. 10-2012-0037582

(51) Int. Cl.
G06F 17/10 (2006.01)
H03M 1/66 (2006.01)
H03M 3/00 (2006.01)

(52) U.S. Cl.
CPC ............ *G06F 17/10* (2013.01); *H03M 1/665* (2013.01); *H03M 3/464* (2013.01)

(58) Field of Classification Search
None
See application file for complete search history.

(56) References Cited

U.S. PATENT DOCUMENTS

| | | | |
|---|---|---|---|
| 5,189,636 A * | 2/1993 | Patti et al. | 708/706 |
| 5,221,926 A | 6/1993 | Jackson | |
| 7,463,175 B2 | 12/2008 | Kim | |
| 7,702,989 B2 * | 4/2010 | Graef et al. | 714/780 |
| 7,719,455 B2 | 5/2010 | Kim et al. | |
| 7,808,409 B2 | 10/2010 | Kim | |
| 2009/0167581 A1 | 7/2009 | Hagiwara et al. | |

FOREIGN PATENT DOCUMENTS

KR   10-2008-0020096 A   3/2008

OTHER PUBLICATIONS

Inamdar et al; Digital Encoder for RF Transmit Waveform Synthesizer; Jun. 2007; IEE Transactions on Applied Superconductivity; pp. 556-560.*

(Continued)

*Primary Examiner* — Michael D Yaary
(74) *Attorney, Agent, or Firm* — Rabin & Berdo, P.C.

(57) ABSTRACT

Disclosed are an accumulator for reducing nonlinearity of a data converter and a data weighted average device including the accumulator. According to the accumulator including a register configured to output input data according to a clock signal; a first adder configured to receive a digital input signal having any bit width and an output signal from the register to perform an add operation; a preset unit configured to output a preset value or a 0 value according to whether a carry of the first adder is generated; and a second adder configured to receive an output signal of the first adder and an output signal of the preset unit to perform the add operation and input the add operation to the register and the data weighted average device including the accumulator, it is possible to improve the nonlinearity occurring in the data converter by generating a number of DAC codes in addition to $2^n$ DAC codes.

4 Claims, 5 Drawing Sheets

(56) References Cited

OTHER PUBLICATIONS

Matt Park et al., "A 0.13μm CMOS 78dB SNDR 87mW 20MHz BW CT ΔΣ ADC with VCO-Based Integrator and Quantizer", 2009 IEEE International Solid-Sate Circuits Conference, pp. 170-171 and 1 page of ISSCC 2009 Paper Continuations.

Sun-Hong Kim et al., "Wideband multi-bit third-order sigma-delta ADC for wireless transceivers", ASIC, 2003. Proceedings. 5th International Conference on, Oct. 21-24, 2003.

Henrik Jensen et al., "A low-complexity dynamic element matching technique for reduced-distortion digital-to-analog conversion", Circuits and Systems, 1999. ISCAS '99. Proceedings of the 1999 IEEE International Symposium on, Jul. 1999, vol. 2, pp. II-1-II-4.

* cited by examiner (a)　　　　　　　　　(b)

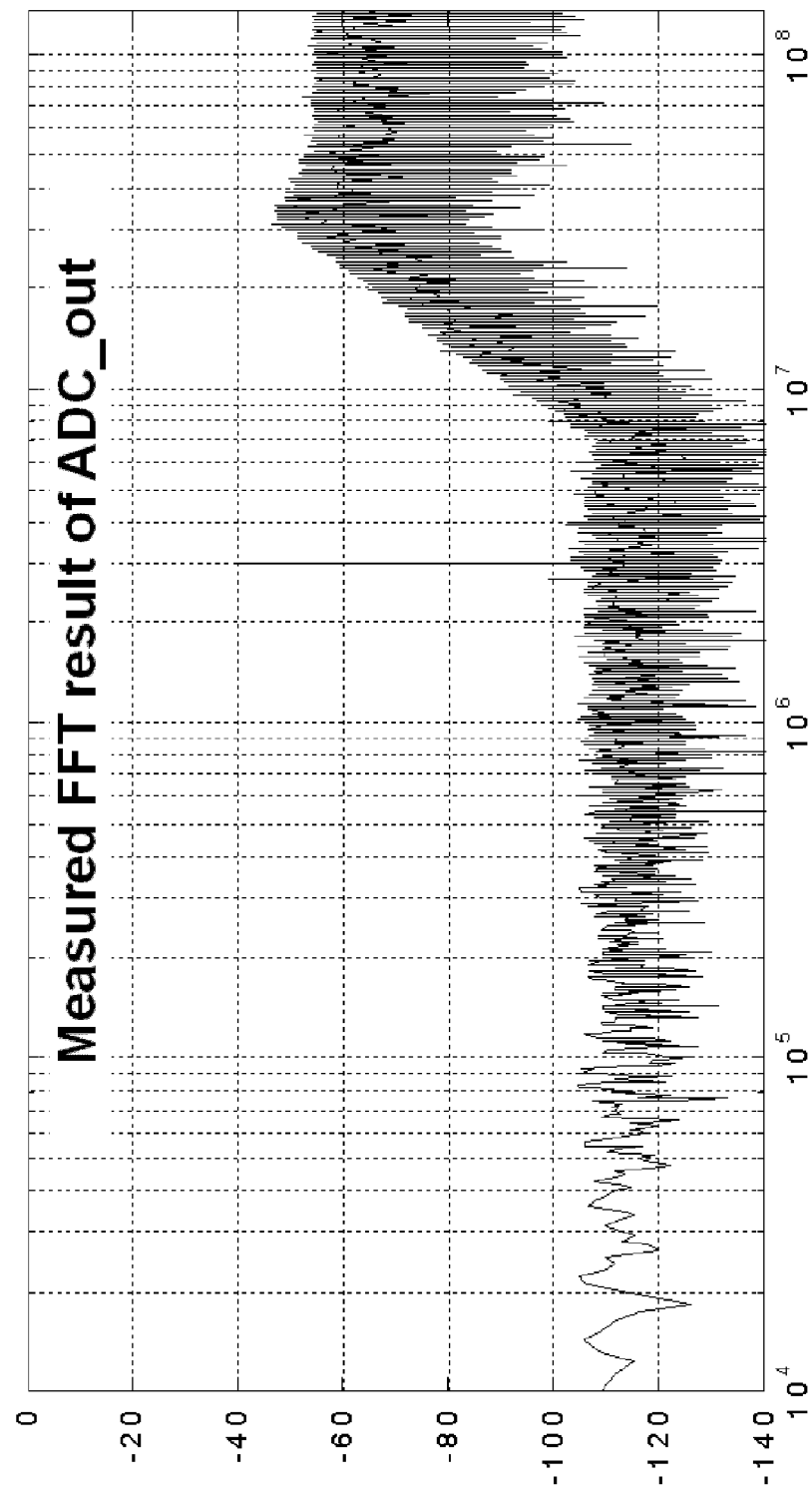

ACCUMULATOR AND DATA WEIGHTED AVERAGE DEVICE INCLUDING THE ACCUMULATOR

CROSS-REFERENCES TO RELATED APPLICATIONS

The present application claims priority under 35 U.S.C 119(a) to Korean Application No. 10-2012-0037582, filed on Apr. 10, 2012, in the Korean Intellectual Property Office, which is incorporated herein by reference in its entirety set forth in full.

BACKGROUND

Exemplary embodiments of the present invention relate to an accumulator and a data weighted average device including the same, and more particularly, to an accumulator for reducing nonlinearity of a data converter and a data weighted average device including the accumulator.

Nonlinearity of an output signal is one of the important design factors in a data converter. The nonlinearity largely reduces a signal-to-noise and distortion ratio (SNDR) of the output signal.

Generally, a digital-to-analog converter (hereinafter, referred to as 'DAC') affects linearity of the output element due to several factors. Among these factors, various types of mismatches of each unit component of the DAC have a serious effect on nonlinearity. In actual implementation, a data weighted average (DWA) method has been applied in order to improve the nonlinearity due to the mismatches.

An object of the data weighted average method changes a distribution of paths switching each unit component to randomly show a mismatch effect.

FIG. 1 is a block diagram of an ADC to which the DAC is applied.

FIG. 1 illustrates a general multi-bit delta-signal analog-to-digital converter (hereinafter, referred to as 'ADC') 10 that converts an analog input signal As_in into a digital output signal DS_out.

The multi-bit delta-sigma ADC 10 includes an integrator and adder 11, a multi-level quantizer 12, a DAC 13, a data weighted average unit 14, and an output decoder (DEC) 15.

The multi-bit delta-sigma ADC 10 is a data converter that has been mainly used for applications requiring high bit resolution. When the multi-bit delta-sigma ADC 10 has high resolution or wide bandwidth, the multi-bit quantizer 12 is used and the multi-bit DAC 13 is required since the output signal is transmitted to an input end through a feedback. As described above, the data weighted average method is required due to the use of the DAC 13.

In particular, the multi-bit delta-sigma ADC 10 having a feedback loop shows initial noise of an input on an output as it is, and therefore, the linearity of the signal fed back to the DAC 13 is considerably important.

FIGS. 2A and 2B are diagrams for describing a configuration and an operation principle of a general data weighted average unit used in the DAC.

Referring to FIG. 2A, the data weighted average unit includes a log shifter 21 that converts a path through which an input digital signal D_in of m bits is transmitted as an output by a control signal of k bits and a counter 22 that generates the control signal of k bits.

An output signal D_out of n bits controls the DAC units based on a configuration block, as appearing in an operation sample illustrated in FIG. 2B. When the DAC unit is large in an order of 2-1-1-2-3-2-3-2- . . . , the output from the data weighted average unit reduces the nonlinearity occurring from the DAC by being sequentially turned-on without repeatedly turning-on the same cell.

Here, when the DAC unit is $2^n$, the counter 22 of the data weighted average unit implements a circuit counting $2^n$, which can be easily implemented using an N-bit counter or an N-bit accumulator.

However, when counting $2^n$, a bit width of the DAC is implemented to meet $2^n$ and therefore and therefore, when intending to implement the required optimal bit width of the DAC, there is a problem in that the bit width cannot be implemented using the N-bit counter or the N-bit accumulator.

As the related art, there is KR Patent Laid-Open No. 2008-0020096 (Publication on Mar. 5, 2008, Title of the Invention: Multi-bit Data Converter Using Data Weighted Averaging).

The above-mentioned technical configuration is a background art for helping understanding of the present invention and does not mean related arts well known in a technical field to which the present invention pertains.

SUMMARY

An embodiment of the present invention is directed to an accumulator capable of improving nonlinearity occurring in a data converter and optimizing a bit width of a DAC, by generating a number of DAC codes in addition to $2^n$ DAC codes in implementing a data weighted average unit and a data weighted average device including the accumulator.

An embodiment of the present invention relates to an accumulator, including: a register configured to output input data according to a clock signal; a first adder configured to receive a digital input signal having any bit width and an output signal from the register to perform an add operation; a preset unit configured to output a preset value or a 0 value according to whether a carry of the first adder is generated; and a second adder configured to receive an output signal of the first adder and an output signal of the preset unit to perform the add operation and input a result of the add operation to the register.

The preset unit may include: a first switch configured to be turned-on when the carry of the first adder is generated to output a preset value to the second adder; and a second switch configured to be turned-on when the carry signal of the first adder is not generated to output the 0 value to the second adder.

The preset value may be programmed so that the accumulator could count any natural number M for the digital input signal.

Another embodiment of the present invention relates to a data weighted average device, including: a data weighted average pointer circuit based on an accumulator configured to generate a pointer value corresponding to a digital input signal as a control signal; and a log shifter configured to perform path conversion of the digital input signal to an output signal according to the control signal output from the data weighted average pointer circuit based on the accumulator.

The data weighted average pointer circuit based on the accumulator may include: a thermometer binary converter configured to receive the digital input signal that has any bit width and is a thermometer code and convert the received digital input signal into a binary code; and a modular M accumulator configured to use a preset value to count the binary code into any natural number M value.

The modular M accumulator may include: a register configured to output input data according to a clock signal; a first adder configured to receive the digital input signal and an output signal of the register to perform an add operation; a preset unit configured to output the preset value or a 0 value according to whether a carry of the first adder is generated; and a second adder configured to receive an output signal of the first adder and an output signal of the preset unit to perform the add operation and input a result of the add operation to the register.

The preset unit may include: a first switch configured to be turned-on when the carry of the first adder is generated to output a preset value to the second adder; and a second switch configured to be turned-on when the carry signal of the first adder is not generated to output the 0 value to the second adder.

The preset value may be programmed so that the accumulator could count any natural number M for the digital input signal.

BRIEF DESCRIPTION OF THE DRAWINGS

The above and other aspects, features and other advantages will be more clearly understood from the following detailed description taken in conjunction with the accompanying drawings, in which:

FIG. 6 is a diagram illustrating chip manufacturing measuring results of the delta-sigma ADC illustrated in FIG. 5.

DESCRIPTION OF SPECIFIC EMBODIMENTS

Figure 1:
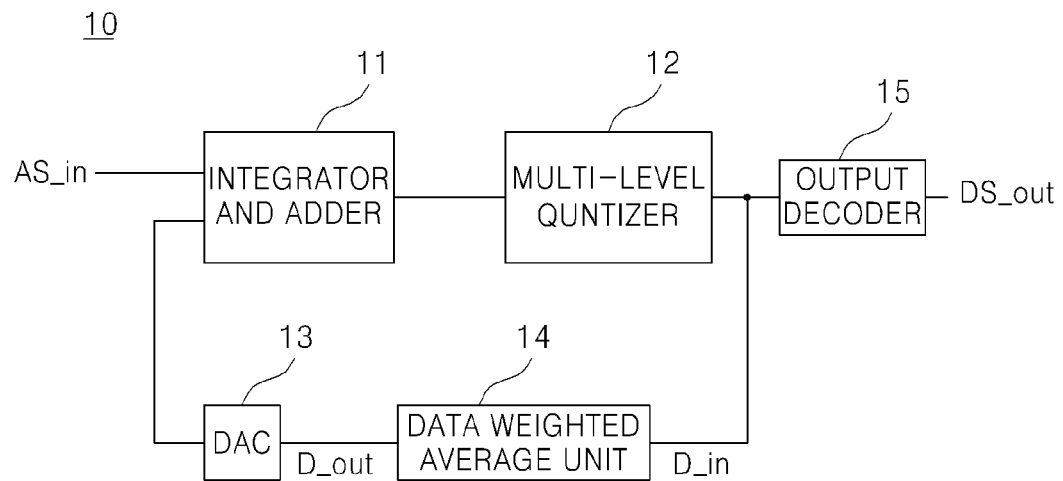
FIG. 1 is a block diagram of an ADC to which the DAC is applied.

Hereinafter, an accumulator and an authentication method using a data weighted average device including the accumulator in accordance with an embodiment of the present invention will be described in detail with reference to the accompanying drawings. During the process, a thickness of lines, a size of components, or the like, illustrated in the drawings may be exaggeratedly illustrated for clearness and convenience of explanation. Further, the following terminologies are defined in consideration of the functions in the present invention and may be construed in different ways by intention or practice of users and operators. Therefore, the definitions of terms used in the present description should be construed based on the contents throughout the specification.

Figure 3:
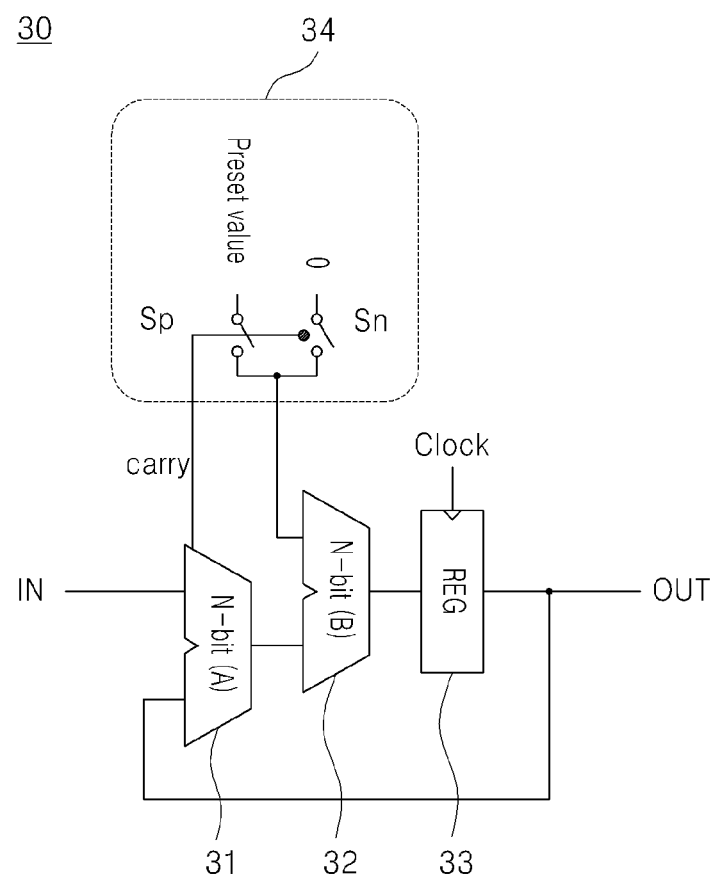
FIG. 3 is a block diagram illustrating a configuration a modulo M accumulator in accordance with an embodiment of the present invention.

FIG. 3 is a block diagram illustrating a configuration a modulo M accumulator in accordance with an embodiment of the present invention.

A modulo M accumulator in accordance with an embodiment of the present invention may use a preset value to count any M value other than $2^N$. Here, M is a natural number.

As illustrated in FIG. 3, the modulo M accumulator in accordance with the embodiment of the present invention includes a first adder 31, a second adder 32, a register 33, and a preset unit 34.

The first adder 31 is an N bit adder and performs an add operation by receiving a binary weighted N-bit digital signal IN and a signal fed back from the register 33 and generates a carry when an output value exceeds $2^N$ and otherwise, does not generate the carry.

An output from the first adder 31 is transmitted to an input of the second adder 32.

The preset unit 34 transmits a preset value or a 0 value to the input of the second adder 32 according to the carry signal of the first adder 31.

When the carry is generated in the first adder 31, the carry signal is transmitted to the preset unit 34 to turn-on a first switch Sp, thereby transmitting the preset value to another input of the second adder 32. The preset value may be a digitalized value.

Alternatively, when the carry does not occur in the first adder 31, the preset unit 34 turns-on a second switch Sn, thereby transmitting a 0 value to another input of the second adder 32.

The second adder 32 receives the output from the first adder 31 and an output from the preset unit 34 to perform the add operation. In this case, only a desired M value can be counted by inputting the preset value whenever the second adder 32 again starts counting from 0. The output from the second adder 32 is output as an output signal OUT according to a clock signal input to the register 33.

Figure 4:
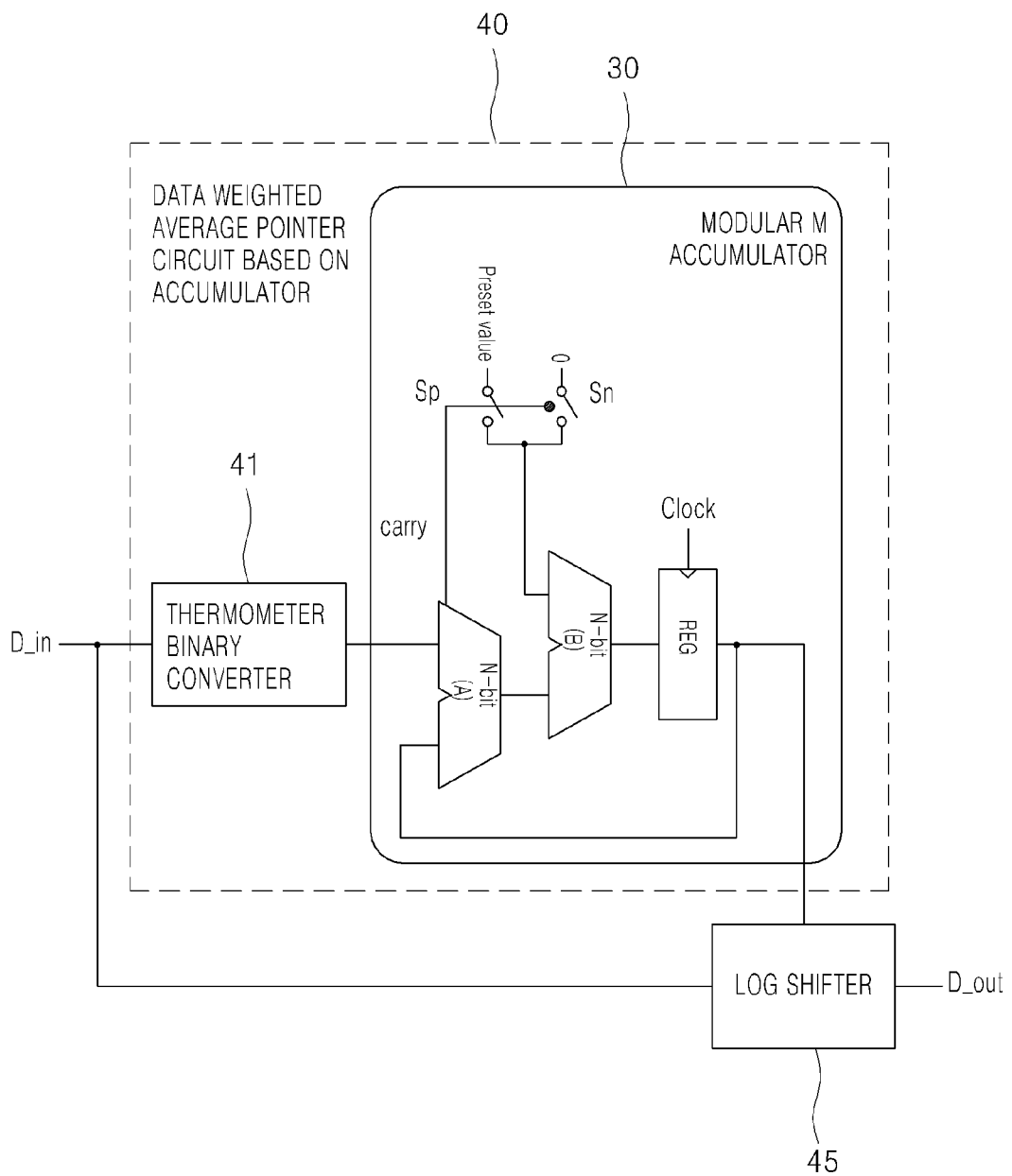
FIG. 4 is a block diagram illustrating a configuration of a data weighted average device implemented using a modulo M accumulator in accordance with an embodiment of the present invention.

FIG. 4 is a block diagram illustrating a configuration of a data weighted average device implemented using the modulo M accumulator in accordance with an embodiment of the present invention.

The data weighted average device in accordance with the embodiment of the present invention includes a data weighted average pointer circuit 40 based on the accumulator and a log shifter 45.

The data weighted average pointer circuit 40 based on the accumulator includes a thermometer binary converter 41 that converts a digital input signal D_in of a thermometer code into a binary code and the modulo M accumulator 30 described with reference to FIG. 3.

An output value of the thermometer binary converter 41, that is, a value obtained by converting the digital input signal of the thermometer code into a binary code is an input signal of the modular M accumulator 30.

The log shifter 45 converts a path of the input signal D_in according to a control signal output from the data weighted average pointer circuit 41 based on the accumulator so as to be output as an output signal D_out.

Figure 2:
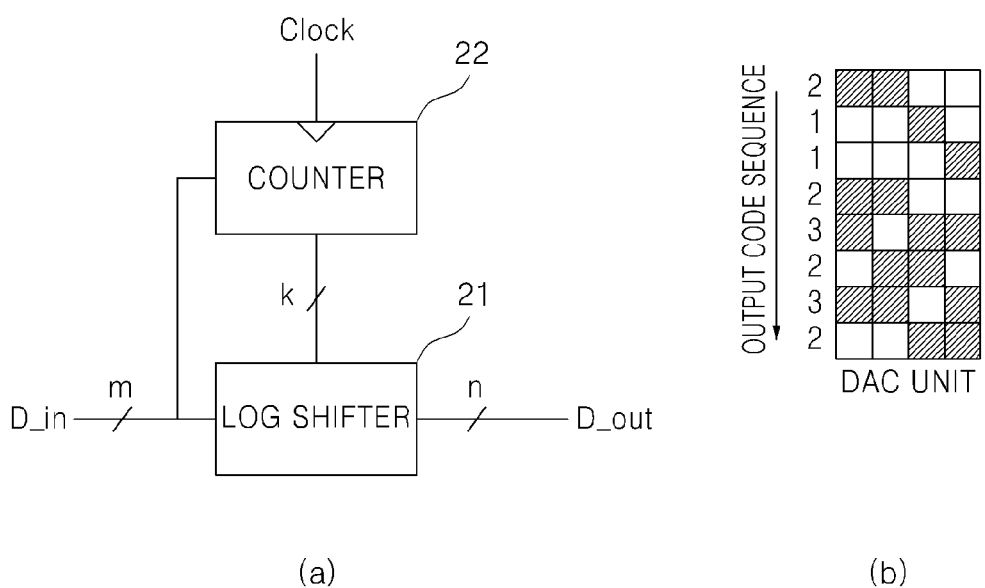
FIG. 2 is a diagram for describing a configuration and an operation principle of a general data weighted average unit used in the DAC.

The log shifter 45 may be implemented as a path switch array that converts a path so that a cell unit of a DAC is turned-on/off according to an output code sequence (D_out code sequence) in an operation sample as illustrated in FIG. 2B according to the input control signal.

Figure 5:
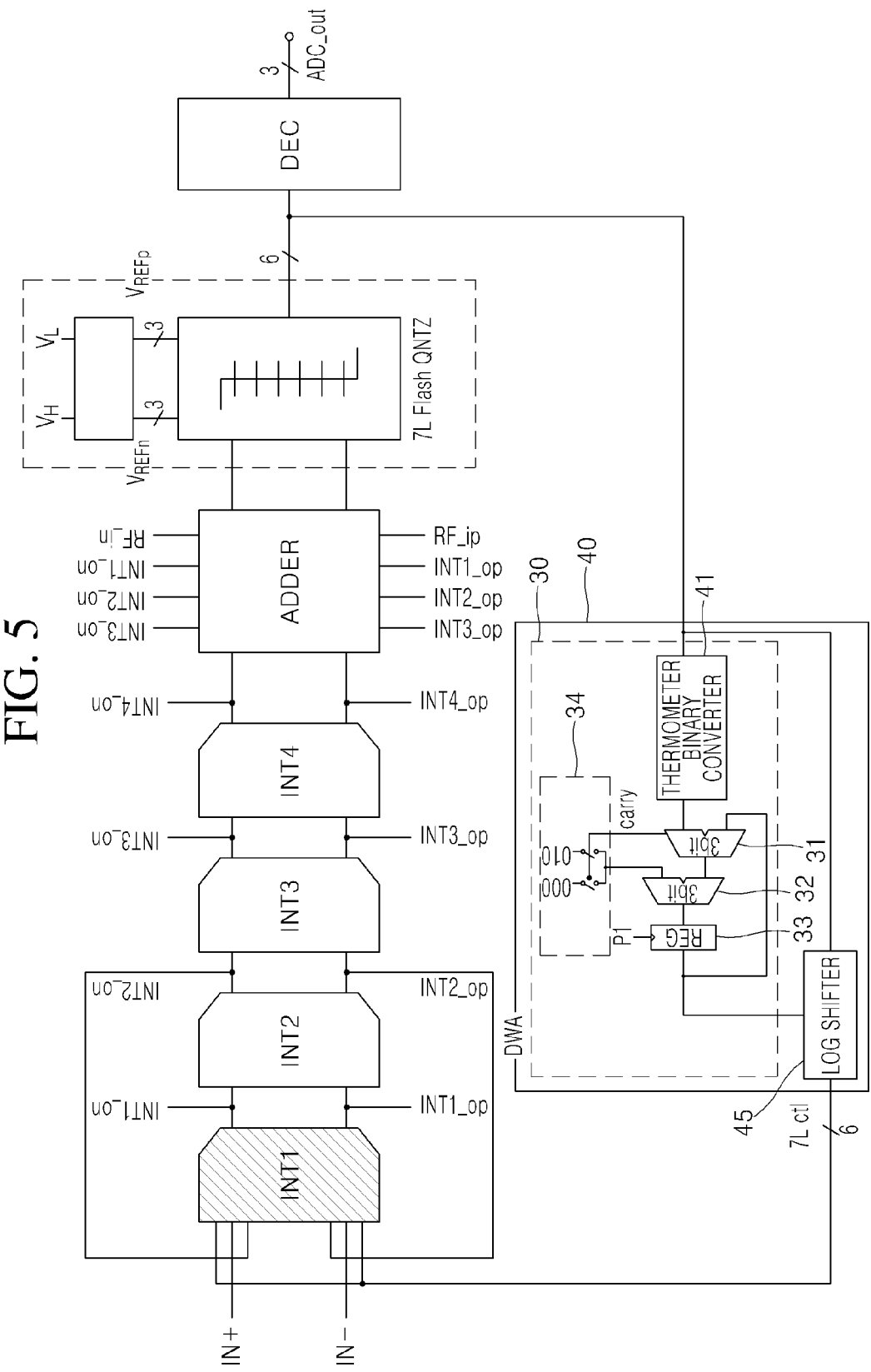
FIG. 5 is a block diagram of a delta-sigma ADC to which the data weighted average device in accordance with the embodiment of the present invention is applied.

FIG. 5 is a block diagram of a delta-sigma ADC to which the data weighted average device in accordance with the embodiment of the present invention is applied and FIG. 6 is a diagram illustrating chip manufacturing measuring results of the delta-sigma ADC illustrated in FIG. 5.

Referring to FIG. 6, it can be confirmed from measured results that a spur ton is not output due to nonlinearity of the DAC.

The data weighted averaged device in accordance with the embodiment of the present invention may use the modular M accumulator to calculate a pointer value of the log shifter even when the number of cells is M other than $2^N$. The present invention can optimize the bit width of the DAC by counting any M as compared to the $2^N$ pointers.

In accordance with the embodiments of the present invention, it is possible to improve the nonlinearity occurring in the data converter by generating a number of DAC codes in addition to $2^n$ DAC codes in implementing the data weighted average unit.

In addition, in accordance with the embodiments of the present invention, it is possible to optimize the bit width of the DAC by generating a number of counting in addition to $2^n$ counting due to the use of two accumulators and the preset value at the time of generating the carry of the accumulators.

Although the embodiments of the present invention have been described in detail, they are only examples. It will be appreciated by those skilled in the art that various modifications and equivalent other embodiments are possible from the present invention. Accordingly, the actual technical protection scope of the present invention must be determined by the spirit of the appended claims.

What is claimed is:

1. A data weighted average device, comprising:
   a data weighted average pointer circuit based on an accumulator configured to generate a pointer value corresponding to a digital input signal as a control signal; and
   a log shifter configured to perform path conversion of the digital input signal to an output signal according to the control signal output from the data weighted average pointer circuit based on the accumulator,
   wherein the data weighted average pointer circuit based on the accumulator includes:
   a thermometer binary converter configured to receive the digital input signal that has a bit width and is a thermometer code and convert the received digital input signal into an N bit binary code; and
   a modular M accumulator configured to use a preset value as a start value to count the N bit binary code into any natural number M value when a carry is generated as a result of a first add operation, the first add operation being performed to add the N bit binary code to a feedback signal,
   wherein the preset value is a difference value between $2^N$ and the M, N and M being natural numbers.

2. The data weighted average device of claim 1, wherein the modular M accumulator includes:
   a register configured to output input data as the feedback signal according to a clock signal;
   a first adder configured to receive the N bit binary code and the feedback signal to perform the first add operation;
   a preset unit configured to output the preset value or a 0 value according to whether the carry is generated as the result of the first add operation; and
   a second adder configured to receive an output signal of the first adder and an output signal of the preset unit to perform a second add operation and input a result of the second add operation to the register.

3. The data weighted average device of claim 2, wherein the preset unit includes:
   a first switch configured to be turned on when the carry is generated to output the preset value to the second adder; and
   a second switch configured to be turned on when the carry is not generated to output the 0 value to the second adder.

4. The data weighted average device of claim 1, wherein the any natural number M is a natural number other than $2^N$.

* * * * *